United States Patent [19]

Karner et al.

[11] Patent Number: 5,753,045
[45] Date of Patent: May 19, 1998

[54] VACUUM TREATMENT SYSTEM FOR HOMOGENEOUS WORKPIECE PROCESSING

[75] Inventors: Johann Karner, Feldkirch, Austria; Mauro Pedrazzini, Eschen, Liechtenstein; Erich Bergmann, Basel, Switzerland

[73] Assignee: Balzers Aktiengesellschaft, Liechtenstein

[21] Appl. No.: 499,989

[22] Filed: Jul. 10, 1995

[30] Foreign Application Priority Data

Jan. 25, 1995 [CH] Switzerland .............. 200/95

[51] Int. Cl.⁶ .............. C23C 16/00; C23F 1/02
[52] U.S. Cl. .............. 118/723 HC; 118/723 DC; 118/723 FE; 118/729; 156/345; 315/111.21
[58] Field of Search .............. 118/723 HC, 723 DC, 118/729, 723 FE; 156/345; 315/111.21

[56] References Cited

U.S. PATENT DOCUMENTS

| | | | |
|---|---|---|---|
| 4,421,592 | 12/1983 | Shuskus | 156/613 |
| 4,509,451 | 4/1985 | Collins | 118/50.1 |
| 4,612,207 | 9/1986 | Jansen | 427/39 |
| 4,643,952 | 2/1987 | Kurakata | 428/472 |
| 4,762,756 | 8/1988 | Bergmann | 428/698 |
| 4,782,267 | 11/1988 | Collins | 315/111.01 |
| 4,840,139 | 6/1989 | Takei | 118/723 |
| 4,893,584 | 1/1990 | Doehler | 118/723 MW |
| 4,930,442 | 6/1990 | Iida et al. | 118/723 |
| 4,953,498 | 9/1990 | Hasizume | 118/719 |
| 4,969,416 | 11/1990 | Schumaker et al. | 118/725 |
| 4,998,968 | 3/1991 | Misumi | 118/723 |
| 5,095,247 | 3/1992 | Hanamura | 315/111.21 |
| 5,227,202 | 7/1993 | Thiebaud et al. | 427/488 |
| 5,256,206 | 10/1993 | Anthony et al. | 118/723 R |
| 5,336,326 | 8/1994 | Karner | 118/723 HC |
| 5,342,660 | 8/1994 | Cann et al. | 427/577 |
| 5,356,672 | 10/1994 | Schmitt, III et al. | 427/446 |
| 5,413,663 | 5/1995 | Shimizu | 156/345 |
| 5,435,849 | 7/1995 | Cann | 118/723 DC |
| 5,490,910 | 2/1996 | Nelson | 204/192.15 |

FOREIGN PATENT DOCUMENTS

| | | |
|---|---|---|
| 0 478 909 A1 | 4/1992 | European Pat. Off. . |
| 0493609 A1 | 7/1992 | European Pat. Off. ........ 118/723 HC |
| 40 29 270 C1 | 4/1992 | Germany . |
| 2-93073 | 4/1990 | Japan .............. 118/723 FE |
| 664 768 A5 | 3/1988 | Switzerland . |
| 2176808 | 1/1987 | United Kingdom . |
| 92/20464 | 11/1992 | WIPO . |

OTHER PUBLICATIONS

Surface & Coatings Technology, Fourth International Conference on Plasma Surface Engineering, Sep. 9–23, 1994 3 pages.

Influence Of Plasma Parameters On The Properties Of Diamond Films Deposited By The D.C. Arc Technique; V. Böhm et al., Jan. 27, 1994; 10 pages.

Radio Frequency Plasma Jet Applied To Coating Of Internal Walls Of Narrow Tubes, L. Bárdoš, S. Berg and H. Baránková, Journal Of Vacuum Science & Technology, Jul./Aug. 1993, No. 4, Part I, three pages.

Primary Examiner—R. Bruce Breneman
Assistant Examiner—Jeffrie R. Lund
Attorney, Agent, or Firm—Evenson, Mckeown, Edwards & Lenahan, P.L.L.C.

[57] ABSTRACT

A process provides for the reactive treatment of workpieces in which a plasma beam is produced in an evacuated recipient. With respect to the area of the highest plasma density along the beam axis, workpieces are arranged in a radially offset manner. Fresh reactive gas is charged into the recipient and used-up gas is sucked out of the recipient. A vacuum treatment system comprises a plasma beam production arrangement, a gas inlet operatively connected with a reactive gas supply, an axially extending workpiece carrier arrangement radially set off from an axis of a plasma beam produced by the plasma beam production arrangement. The workpiece carrier arrangement mounts a rotational surface coaxial with respect to the axis of the plasma beam and a gas suction system. The process and system are used to deposit metastable layers, including cBN-layers, $\alpha$-$Al_2O_3$ layers, $C_3N_4$ layers, and diamond layers, on the workpieces, to surface treat with reactive chemical compounds, including free radicals, and to coat.

15 Claims, 7 Drawing Sheets

VACUUM TREATMENT SYSTEM FOR HOMOGENEOUS WORKPIECE PROCESSING

BACKGROUND AND SUMMARY OF THE INVENTION

The present invention relates to a process for the reactive treatment of workpieces in which a plasma beam is produced in an evacuated recipient and, with respect to the area of the highest plasma density along the beam axis, workpieces are arranged in a radially offset manner, fresh reactive gas being charged into the recipient and used-up gas being sucked out of the recipient.

The present invention also relates to a vacuum treatment system comprising a plasma beam production arrangement, a gas inlet operatively connected with a reactive gas supply, an axially extending workpiece carrier arrangement radially set off from an axis of a plasma beam produced by the plasma beam production arrangement. The workpiece carrier arrangement mounts a rotational surface coaxial with respect to the axis of the plasma beam and a gas suction system. Moreover, the present invention is further directed to uses of the foregoing process and system such as metastable layers, including cBN-layers, $\alpha$-$Al_2O_3$ layers, $C_3N_4$ layers, and diamond layers, which are deposited on the workpieces, and reactive chemical compounds, including free radicals, which are produced for surface treatment of the workpieces or a coating system.

Swiss Patent CH-PS 664 768 describes a coating process in which a low-voltage arc discharge with a hot cathode is used as the plasma beam. Workpieces are arranged essentially parallel to the beam axis, in a radially offset manner thereto, thus outside the area of the highest plasma density along the beam axis where reactive gas is nozzled in diametrically opposite the workpieces. The admitted reactive gas reacts in the plasma and on the surface of the workpieces to be coated. A reaction product is thus deposited as a layer on the workpiece surfaces. In addition to the remaining fresh reactive gas and the working gas, normally a precious gas such as argon, gaseous reaction products are also sucked out of the chambers. The known arrangement has a disadvantage that no pure metastable layers can be deposited in a large-surface manner.

Specifically with respect to diamond layer depositing, German Patent DE 40 29 270, which corresponds to U.S. patent application Ser. No. 757,694, utilizes a higher plasma density supposedly required for diamond depositing than Swiss Patent CH 664 768 and, at the same time, permits the homogeneous coating of larger workpiece surfaces or more workpieces simultaneously. According to German Patent 40 29 70, homogeneity with this high plasma density can only be achieved by generating a plurality of individual plasma beams side-by-side, to obtain a spatially distributed, uniformly high plasma density.

By way of an example, DE 40 29 270 describes an arrangement of the workpieces with respect to a directed plasma beam in the area of approximately 50% of the maximal plasma density. It was found, however, that with this arrangement it is difficult to achieve the same layer quality over larger surfaces in a reproducible fashion.

It is an object of the present invention to provide a treatment process in which now larger workpiece surfaces and more workpieces simultaneously can be homogeneously treated, particularly coated, in a reproducible manner. That is, they can be treated in a manner which is economical on an industrial scale, and which, as a coating process, is suitable in general for the deposition of metastable layers which are difficult to produce, particularly of diamond, cBN, $\alpha$-$Al_2O_3$ or $C_3N_4$ layers.

This object has been achieved in accordance with the process of the present invention by providing that the workpiece surfaces to be treated in the same manner are arranged around the plasma beam along a longitudinally extending rotational surface.

As used herein, "metastable" is defined as in "Lehrbuch der anorganischen Chemie" (translation, "Inorganic Chemistry Textbook"), Holleman-Wiberg, Walter deGruyter, p. 83 (Berlin, N.Y. 1976, 81st–90th Ed.).

In contrast to the process described in German Patent DE 4 029 270, where the workpieces are arranged in the area of high plasma density of a homogeneously distributed plasma (or at least in an area of 50% of the maximal plasma density), the present invention recognizes that, when an extremely dense plasma is produced in a thin channel, particularly by a heavy-current arc, sufficiently high plasma densities can be achieved at a relatively far distance from the arc in order to be able to deposit even diamond layers there. Particularly in the heavy-current arc, such extremely high plasma densities are produced that the plasma density at the site of the substrates for the diamond deposition will amount to only a few percent of the maximal plasma density in the heavy-current arc center.

BRIEF DESCRIPTION OF THE DRAWINGS

These and other objects, features and advantages of the present invention will become more readily apparent from the following detailed description thereof when taken in conjunction with the accompanying drawings wherein:

FIG. 4 is a graph of five typical temperature curves over the diamond coating time of a diamond coating process of the present invention according to hereinafter described Example 1, the five curves having been taken at specific points along the workpiece carrier of FIG. 3a;

FIG. 5 are scanning electron microscope photographs of the facetting of simultaneously deposited diamond layers according to Example 1 at different points of the workpiece carrier of FIG. 3a;

DETAILED DESCRIPTION OF THE DRAWINGS

Although the treatment process and the system according to the present invention are discussed below specifically with regard to a coating treatment, it should be understood that the process and the system can be used for cleaning and for surface modifications on workpieces without departing from the scope of the present invention.

Figure 1:
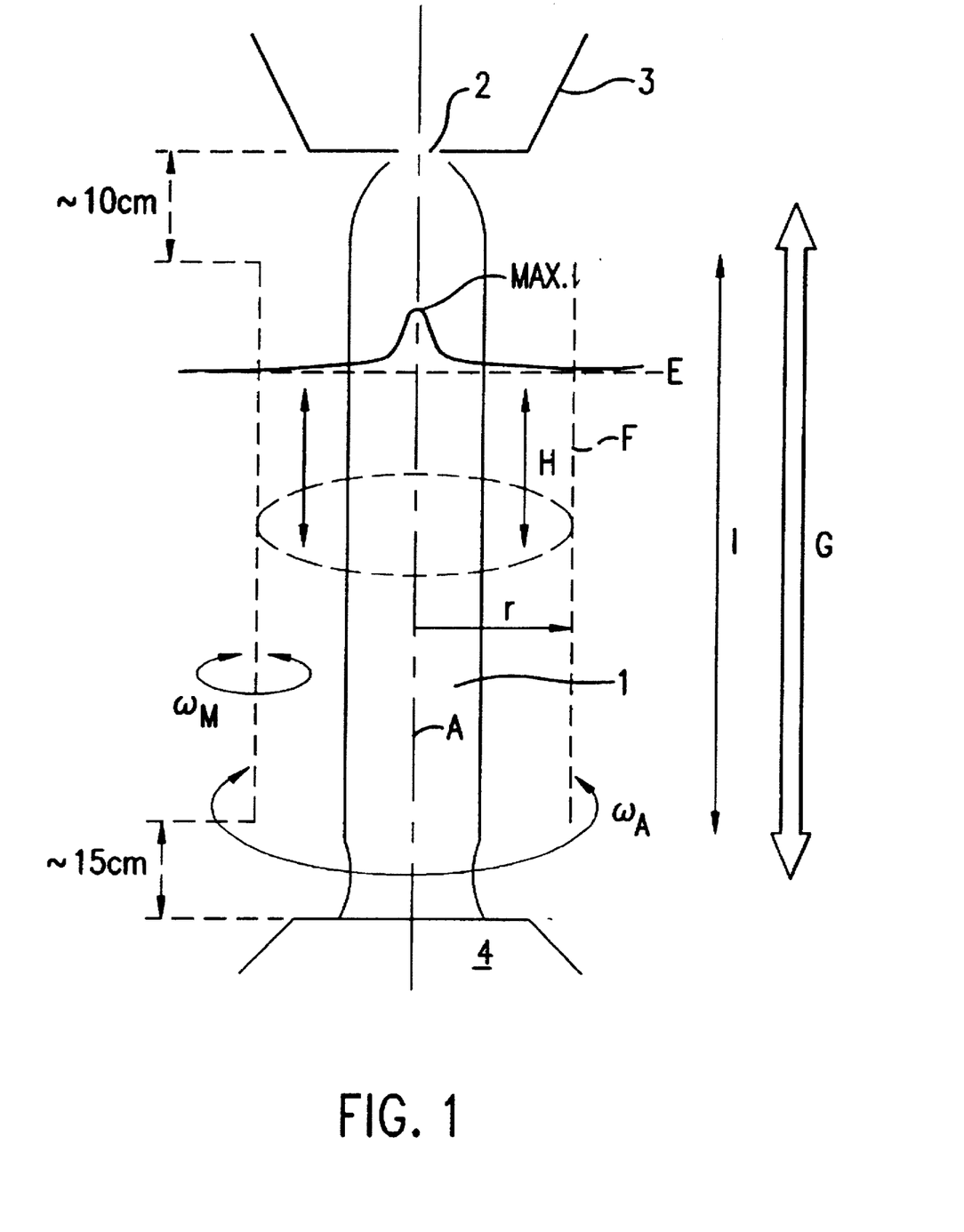
FIG. 1 is a schematic diagram of a heavy-current arc and the respective arrangement of workpieces to be treated, preferably to be coated, according to the present invention.

Referring to the basic approach according to the present invention shown in FIG. 1, the plasma beam, which is preferably configured as a heavy-current arc 1, diverges rapidly beyond within a few centimeters a diaphragm opening 2 of a cathode chamber 3 to a defined dimension in order to maintain a largely constant configuration to shortly in front of the anode 4, that is, up to several centimeters in front of it.

The dimension of the arc in front of the anode 4 depends on the geometrical shape thereof. Thus, with the exception of a small area behind the diaphragm opening 2 and above the anode 4, a largely homogeneous, long area 1 of the heavy-current arc 1 is obtained. Along the beam axis A, as illustrated by way of an example, bell-shaped curve-type distributions of the plasma density are obtained in diametrical sectional planes E. In each plane E, the plasma density distribution has a maximal point Max.

According to the system configuration and its operation, the distances between the cathode 3 and the anode 4 at which the beam becomes homogeneous amount to a few centimeters, for example, about 10 cm at the cathode 3 and about 15 cm at the anode 4 in the embodiment of FIG. 1.

Figure 2:
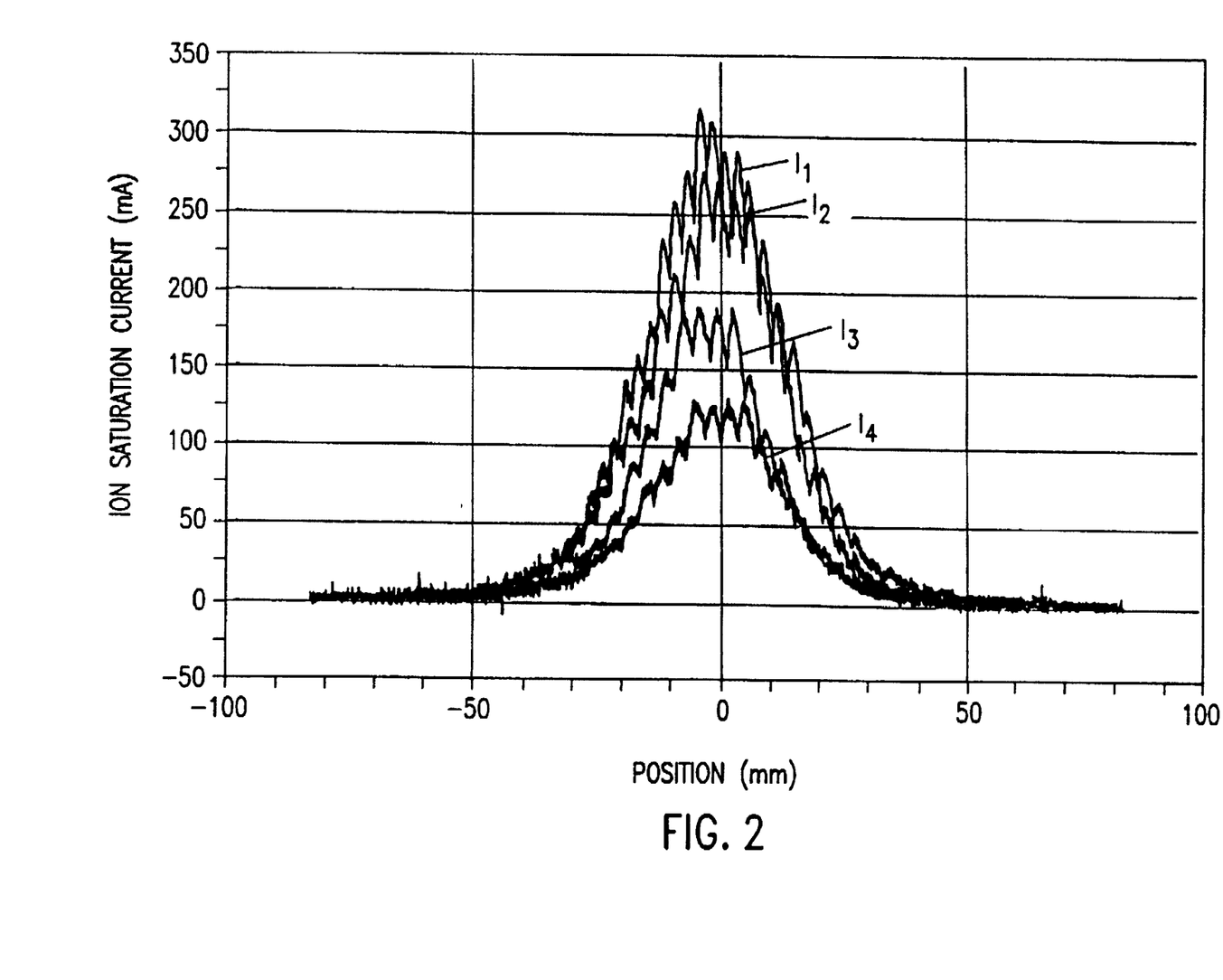
FIG. 2 is a graph of an example of the ion saturation current density distribution on a transverse beam plane according to FIG. 1 in the case of different discharge currents.

FIG. 2 shows the laboratory measured distribution of the ion saturation current density in the plane E. A parameter of the four curves is the arc current, wherein $I_1 > I_2 > I_3 > I_4$. The ion saturation current density is a measurement of the plasma density. FIG. 2 illustrates that the plasma density in the form of a Gaussian curve falls relatively rapidly toward the outside so that the plasma density in a radius of r>50 mm will only have a few % of the maximal plasma density in the arc center. Within the scope of a particularly preferred implementation of the present invention, it is important that the workpieces are arranged in the area of great surface circles of such a low plasma density because the fluctuations of the plasma density which are normal in the case of heavy-current arcs only have a slight effect in the area of such low plasma densities.

Figure 3:
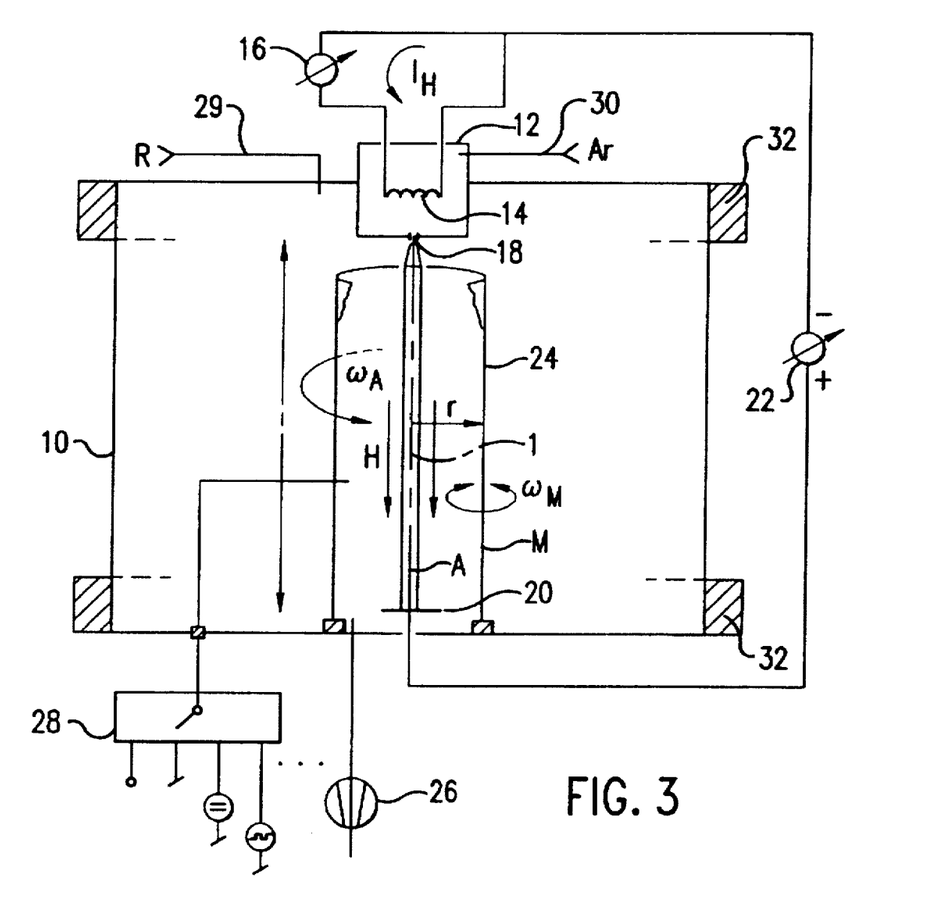
FIG. 3 is a schematic diagram of a system according to the present invention.

The width of the plasma beam can, as seen in FIG. 2, be varied by way of the arc current, but it can also be varied by way of an axial magnetic field as seen in FIG. 3.

An advantage of arranging the workpieces in the area of great surface circles of low plasma density is that the plasma density fluctuates only slightly along the homogeneous area 1 in FIG. 1 so that diamond layers can be deposited along the entire homogeneous area 1. Preferably, the workpieces or substrates are arranged in a plasma density area which amounts to no more than 20%, preferably no more than 10% and most preferably no more than 5%, of the maximal plasma density, Max, in FIG. 1.

This arrangement achieves formation of a plasma source and therefore also a source for generating atomic hydrogen H, which is important for the deposition of metastable layers or for the cleaning or surface modifications of workpieces. As a result of the rotational symmetry of the heavy-current arc and the low fluctuations in the homogeneous area 1, a cylinder surface F is obtained which has a large radius r and a large length 1, and on which a large number of substrates can be treated, e.g. coated, in a homogeneous and reproducible manner.

The following relation may be indicated for the treatment as the characteristic quantity for the correct selection of the distance of the workpieces or substrates from the arc center in the case of a given arc output:

$P/A \geq 10$ W/cm², particularly $\geq 30$ W/cm², wherein

P is the arc output and

A is the treatment or coating surface.

In the illustrated embodiment, the surface of the body rotating about the beam axis is called the treatment or coating surface on which an intended treatment or coating can be achieved. The substrate carriers have a configuration which is as transparent as possible in order to be able to treat or coat a surface that is as large as possible when the output is given.

Furthermore, it may be advantageous to rotate the workpieces along the rotational surface F, particularly the cylindrical surface, about the beam axis A, as indicated at $\omega_A$ in FIG. 1, and/or to let workpieces rotate with respect to a surface line M, as indicated by $\omega_M$, and/or to implement the gas flow from the inlet of the reactive gas to the gas suction in one or the other direction parallel to the beam axis A, as indicated by the double arrow G in FIG. 1. With the last-mentioned rotational and/or gas flow measures, a homogenization of the treatment, particularly of the coating, is additionally achieved.

In the following, the heavy-current arc width, preferably in a controlled manner, will be entered by a magnetic field H set up parallel to the beam axis A, as also shown in FIG. 1.

In the above-described illustrated currently preferred embodiments, the plasma density preferably varies by no more than 100%, preferably no more than 50%, along the surface lines of a rotational surface F used according to the present invention for receiving the workpieces. As required, moreover, higher plasma density variations, in particular can be taken into account by arranging the workpieces along support rings with correspondingly different radii r. In the axially perpendicular diametrical planes E, the respective great circles are situated in a plasma density area which amounts to no more than 20%, preferably no more than 10% and preferably even no more than 5%, of the plasma density maxima.

In the embodiment of FIG. 3, a plasma beam 1 is generated in a vacuum chamber 10, preferably as a heavy-current arc discharge, and more preferably in the form of a hot-cathode low-voltage heavy-current arc discharge according to FIG. 2. However, a cold-cathode arc discharge can also be used without departing from the scope of the present invention.

A cathode chamber 12 is flanged to the vacuum chamber 10 and comprises an electron-emitting hot cathode 14 which is switched into a heating current circuit for the heating current $I_H$, with, preferably, an adjustable heating current generator 16. The anode 20 is arranged opposite a beam emission diaphragm 18 provided on the cathode chamber 12. An adjustable discharge generator 22 is connected between the hot cathode 14 or the heating current circuit and the anode 20. Swiss Patent Document CH 664 768 discloses further details of that arrangement.

A workpiece carrier arrangement 24 defines a cylindrical surface. The radius r is a function of the radiation capacity. For a given radiation capacity, it is determined such that, a plasma radiation capacity of at least 10 W/cm², preferably of at least 30 W/cm², is achieved for each cm² of the cylinder surface to be utilized for the workpiece coating or treatment.

Workpieces to be treated, for example, coated, such as drills, indexable inserts, milling cutters, etc. are positioned along the cylindrical workpiece carrier arrangement 24, in which case (not shown), the whole cylindrical arrangement 24 can be rotated about the beam axis A corresponding to $\omega_A$, or the workpieces can be rotated with respect to surface lines M of the cylindrical arrangement 24 corresponding to $\omega_M$.

Figure 3A:
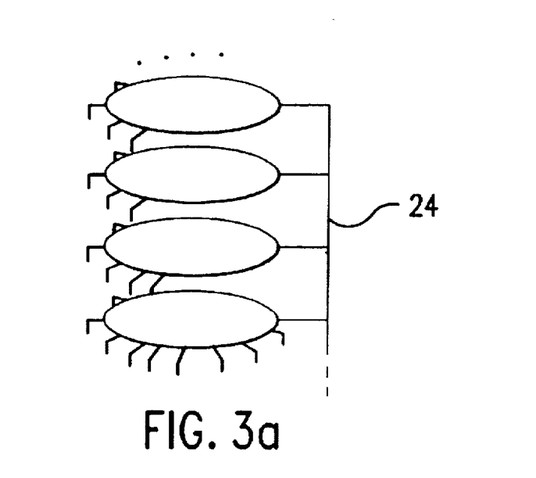
FIG. 3a is a schematic diagram of a preferred shape of the workpiece carrier used in the system of FIG. 3 according to the present invention.

In order to utilize the process gases as efficiently as possible, the substrate carriers, as shown in FIG. 3a, are constructed to be as transparent as possible so that the main surface is formed by the substrates themselves and not by their holding devices.

As shown in FIG. 3, reactive gas R, on the cathode side, is charged at reference numeral 29, into the chamber 10. On the anode, a pump arrangement 26 is provided on the anode side. As a result, a gas flow is generated through the recipient and along the workpiece carrier arrangement 24 mounting the cylinder surface. This gas flow is directed essentially parallel to the axis A. By way of the workpiece carrier arrangement 24, the workpieces are operated either in a potential-to-potential manner or are connected to a reference potential, for example, shunted to earth, or are connected to a DC bias potential, to an AC potential or to a mixed AC+DC potential, such as a pulsed potential. These and other potential laying possibilities for the workpieces are indicated schematically in FIG. 3 together with the change-over unit 28.

A working gas, e.g. Ar, is charged in a known manner into the cathode chamber 12 through a pipe 30. A coil arrangement 32 generates a magnetic field H, which is directed essentially axially parallel, in the beam area, whereby, in a controlled manner. The divergence of the beam 1 or its plasma density distribution can be adjusted along its length.

In accordance with the explanation given with respect to FIG. 1, the cylindrical workpiece carrier arrangement 24 is configured with a radius r in relation to the beam axis A up to approximately 1% of the plasma density of the respective maximal density of the considered plane E. The fluctuation in the surface line direction of this plasma density is no more than 100%, preferably no more than 50%. By way of such an arrangement, to homogeneous deposition of even high-quality diamond layers is achieved along the entire homogeneous arc length l.

By generating a long plasma beam 1 and the utilization of an area of low plasma density according to the present invention, simultaneously and therefore extremely economically, a plurality of workpieces or large workpiece surfaces can be treated, in this example, in particular coated, homogeneously, economically and on an industrial scale. The extremely high plasma density of the heavy-current arc is particularly suitable for depositing high-quality diamond layers on a large surface. The thus produced plasma is, however, also very suitable for depositing layers which generally are extremely difficult to produce, specifically metastable layers, such as cBN—, $\alpha$-$Al_2O_3$— and $C_3N_4$-layers. This plasma is, as previously noted, particularly suitable for the cleaning or general surface modifications of or on workpieces.

For the following examples, a system for diamond coating, as schematically illustrated in FIG. 3, is configured and operated as follows:

Arc length: 50–90 cm

Different workpiece carrier arrangements:

One to eight regularly distributed carrying rings centered along the arc length, each disposed in an electrically insulated manner. The diameter of the rings is adapted to the respective plasma capacity.

Gas mixture: Ar/$H_2$/$CH_4$ at the ratio of 52.2/47.1/0.7%

Total pressure: p=80–200 Pa

Arc current: I=200 to 500A

Axial magnetic field in the beam center: 50–200 Gauss.

EXAMPLE 1

Five rings of the workpiece carrier arrangement of the type seen in FIG. 3a were loaded with cemented carbide indexable inserts so that, on the whole, a large number of plates were processed.

Figure 4:
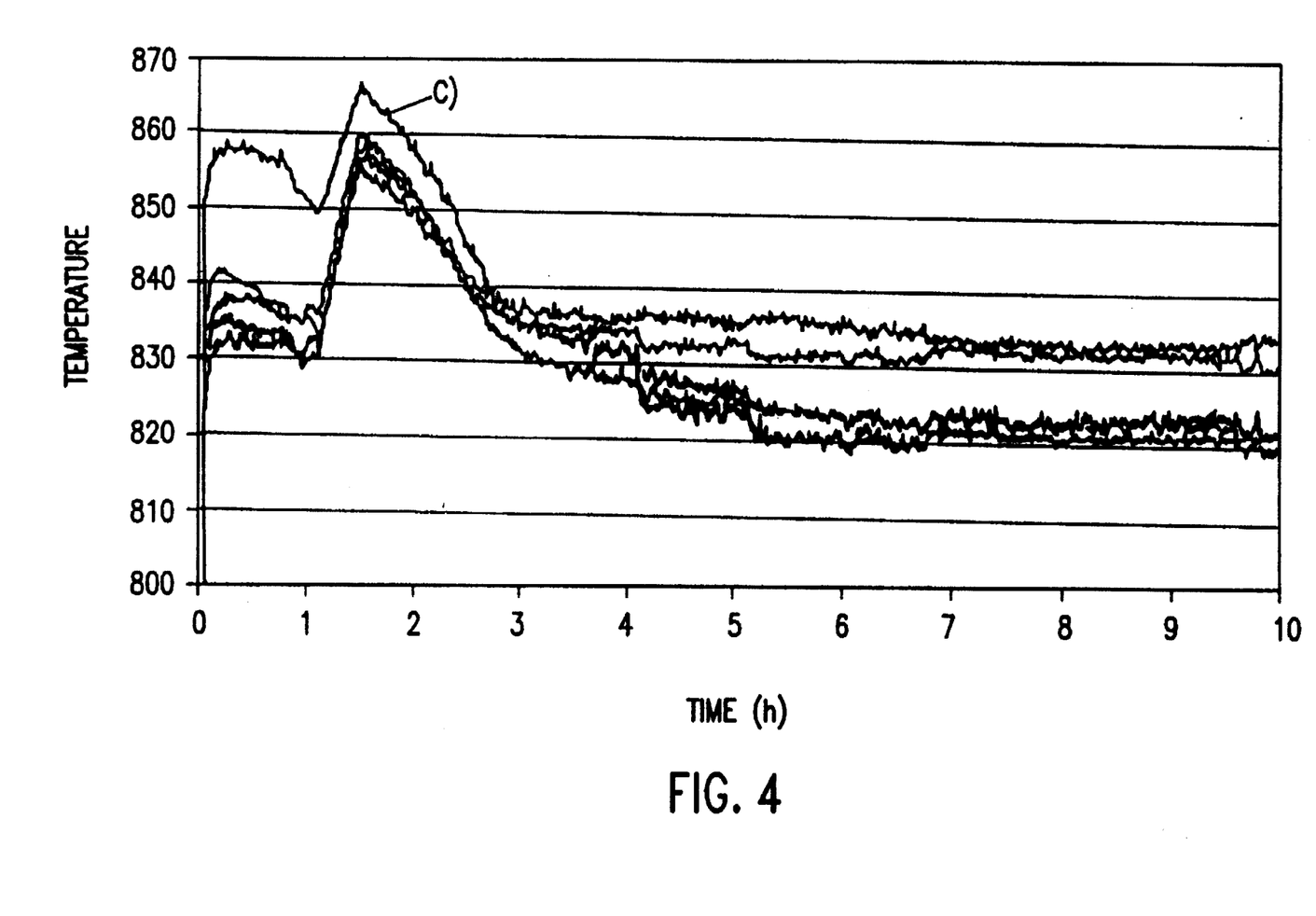

FIG. 4 illustrates, during the processing period, the temperature curve which was measured as follows:

a) At a point of the lowest ring on the anode side which was arranged approximately 15 cm above the anode;

b) on the central ring of the rings which are spaced a few centimeters from one another, thus approximately in the center of the arc, at three measuring points distributed evenly along this ring, and finally c) on the uppermost ring set off approximately 15 to 25 cm from the diaphragm according to FIG. 3.

The last-mentioned measurement is represented in FIG. 4 by the curve c). The temperature differences are in the order of 10°, in the case of an average temperature level of approximately 830°, and corresponds to a temperature variation of approximately only 1%. Hence, the process along the cylinder surface lines and the great circles is perfectly homogeneous.

Figure 5:
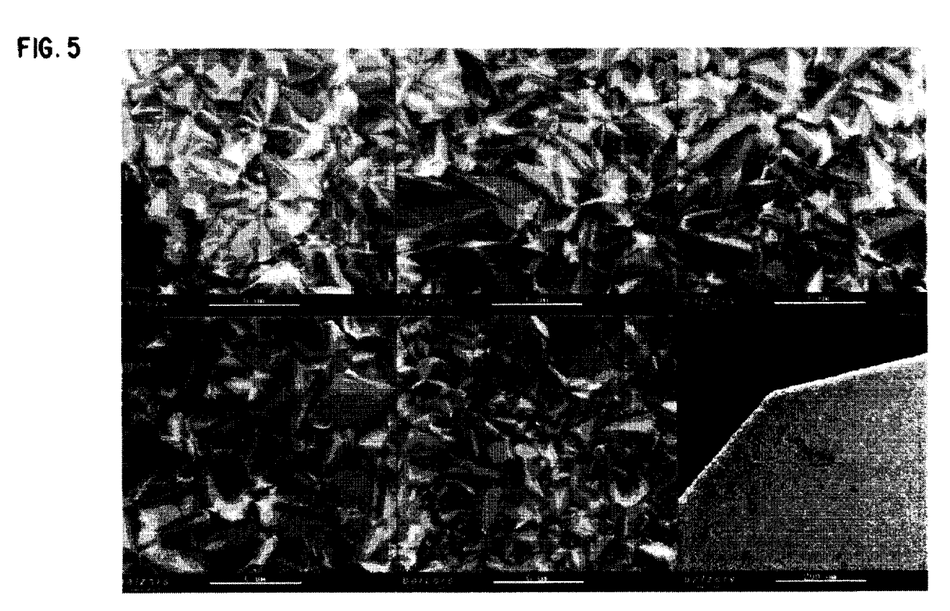

Diamond layers were deposited on all substrates with an excellent facetting. The scanning electron microscope photos show good facetting of the diamond layers on each of the five rings.

Figure 6:
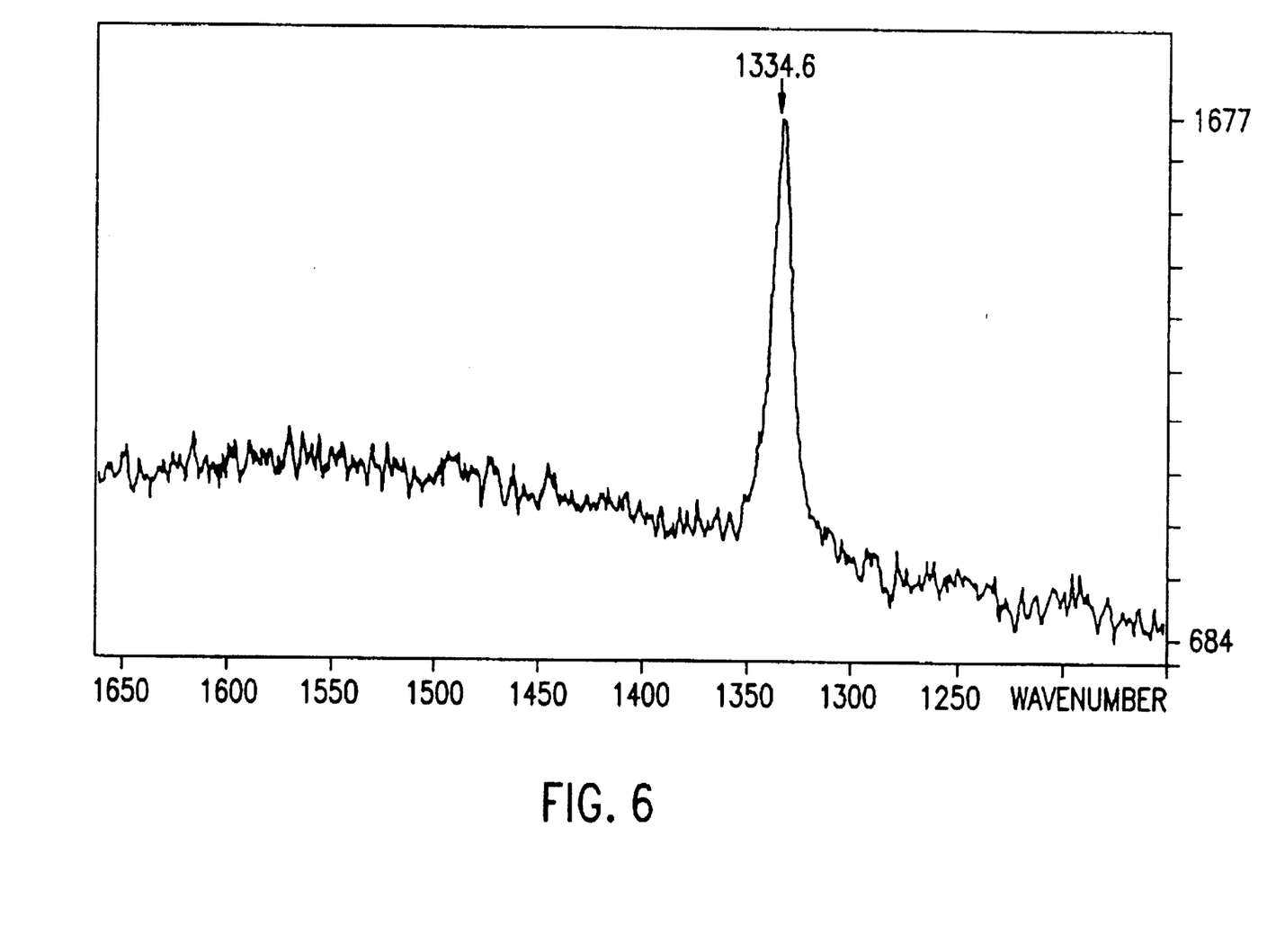
FIG. 6 is a graph of the Raman spectrum of the diamond layer deposited according to Example 1.

FIG. 6 shows the Raman spectrum of the diamond layer deposited according to the present invention. No graphite fraction, which would occur at 1,500 $cm^{-1}$ as a wide shoulder, can be recognized.

Figure 7:
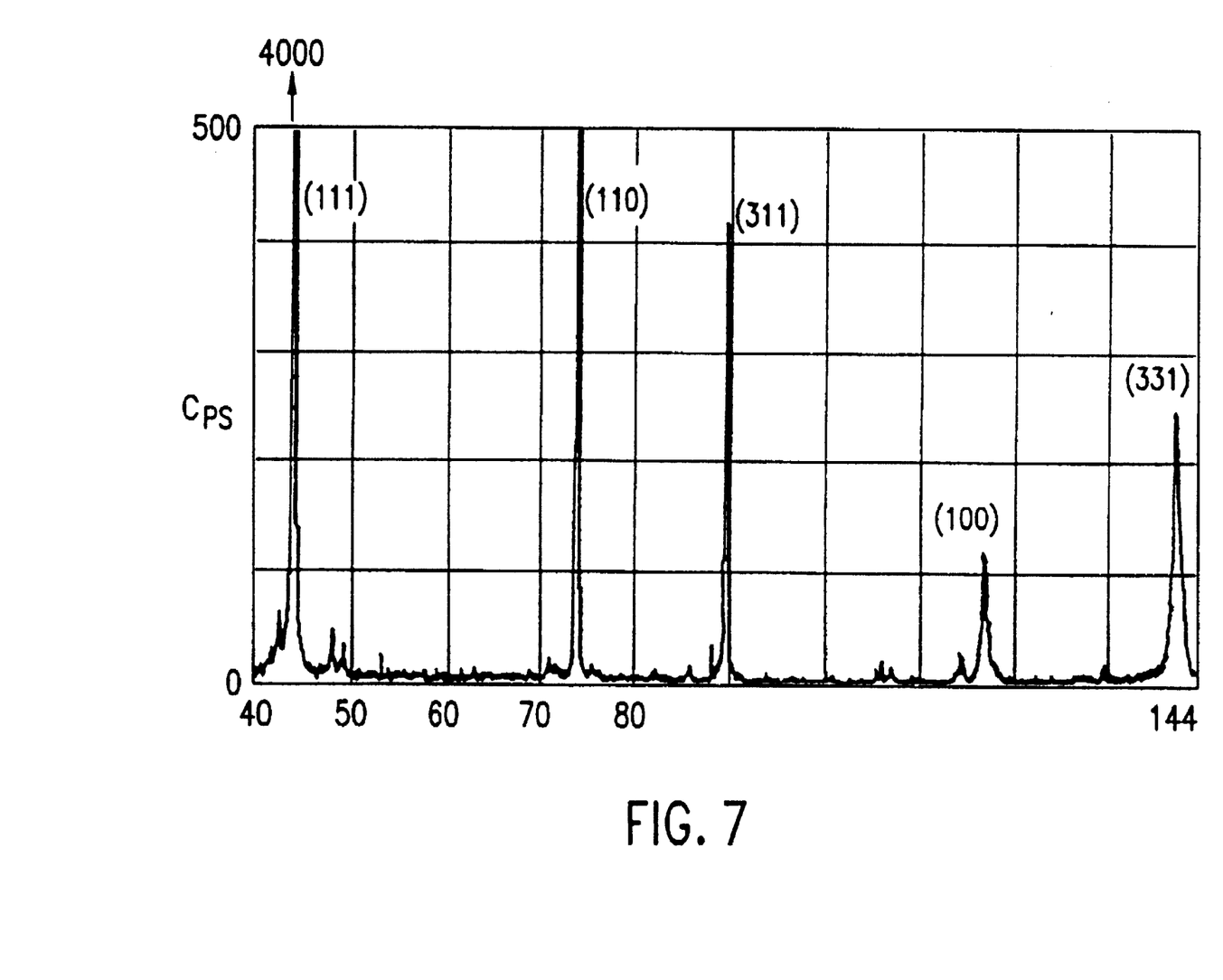
FIG. 7 is a graph of the X-ray diffraction spectrum of the above-mentioned deposited diamond layer on a hard metal substrate.

FIG. 7 is an X-ray diffraction spectrum of the diamond layer produced according to the present invention on the hard-metal substrates in the case of a glancing incidence. All large peaks correspond to the diamond coating in the case of the indicated crystallographic directions, whereas the small peaks originate from the cemented carbide substrate.

The signal of the (111) facetting is not completely illustrated in FIG. 7 and amounted to approximately eight times (8×) the maximum amplitude according to FIG. 7. In the known example, the ratio of the arc output to the coating surface or the surf ace of the workpiece carrier cylinder 24 according to FIG. 3, which is a characteristic measurement of the process according to the present invention, amounted to 47 to 54 W/$cm^2$.

EXAMPLE 2

Instead of the indexable inserts of Example 1, shank-type cutters with a diameter of 8 mm were arranged on four rings centered with respect to the longitudinal beam dimension l. The distance between the individual rings amounted to several centimeters. For each ring, a large number of milling cutters was arranged in a radial manner, with the tip directed against the center A. The diamond layer was produced along a length of 40 mm starting at the tip of the milling cutter, with a slightly decreasing thickness. It was demonstrated thereby that shank-type cutters up to a certain cutter length can also be coated in large piece numbers according to the process of the present invention.

EXAMPLE 3

As illustrated in Example 1, cemented carbide plates (carbide tips) were arranged without any additional cooling device close to the plasma arc, specifically on a radius of only 60 mm, in the case of an arc current of 400 A. Because of the high temperature, only black carbon-type layers and no diamond layers could be deposited.

With respect to Example 1 and Example 2, workpieces may also be arranged at a larger distance from the plasma beam, in which case, either its power must be increased or a lower coating rate must be accepted.

According to the present invention, other metastable phases, which are difficult to produce, such as cBN or $\alpha$-$Al_2O_3$ or $C_3N_4$, may also be deposited as layers. $BCl_3$ (boron chloride), $B_2H_6$ (diborane), $B_3N_3H_6$ (borazine), for example, may be used as gases for the cBN deposition; N2 or NH3 may be used as N carriers; and $AlCl_3$- or trimethyl aluminum, for example, may be used for the $Al_2O_3$-layer. However, B or Al may just as well be charged into the reaction space by way of a physical process, such as electron beam evaporation or thermal evaporation.

It was therefore basically found that the diffusion range of heavy-current arc discharges, such as the area having a plasma density $\leq$20% of the beam center plasma density, is extremely well suited for the deposition of extremely hard layers, particularly for the deposition of layers made of metastable phases which, under normal conditions, are difficult to produce, such as diamond, cBN, $\alpha$-$Al_2O_3$ and $C_3N_4$ layers. With these density conditions, largely homogeneous conditions exist along a large arc length, so that optimally many workpieces can be coated simultaneously with an optimal utilization of a heavy-current arc discharge.

In particular, the arrangement of the substrates in an area of very low plasma density has the advantage that the plasma density profile (see FIG. 2) is very flat and the plasma density therefore depends little on the radial position. The radius of the substrate carrier rings (FIG. 3a) is, however, selected such that no cooling of the substrates is required which at high temperatures of 800° C. would result in high expenditures.

Although, in the present context, the heavy-current arc was generated as a hot-cathode low-voltage discharge or a cold-cathode discharge, the present invention also contemplates using a plasma jet as a plasma beam. With respect to the entire subject area of implementing plasma jets, reference is made, for example, to *J. Electrochem Soc.*, Vol. 137, No. 2, February 1990, Pages 717 to 722.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A vacuum treatment system, comprising a plasma beam generation production arrangement for generating a plasma beam along an axis in which plasma density of the plasma beam is at a maximum; a gas inlet operatively connected with a reactive gas supply, a gas suction system, and a workpiece carrier arrangement which includes workpiece supports arranged radially offset from and around the plasma beam axis in an area where the plasma density is no greater than 20% of maximum plasma density in a plane perpendicular to the plasma beam axis and containing the workpiece supports.

2. The system according to claim 1, wherein the workpiece carrier arrangement defines a surface of rotation with respect to the plasma beam axis.

3. The system according to claim 1, wherein the plasma beam production arrangement is configured to produce, with one of a hot cathode and a cold cathode, a low-voltage arc discharge.

4. The system according to claim 3, wherein the arc discharge is a heavy-current arc discharge.

5. The system according to claim 1, wherein an axial dimension of a rotational surface defined by the workpiece carrier arrangement around the plasma beam axis extends between positions approximately 15 cm in front of an anode of the plasma beam production arrangement and approximately 10 cm behind a diaphragm of a cathode chamber for a hot-cathode discharge.

6. The system according to claim 1, wherein means is provided for generating an axially parallel magnetic field along at least one area of the plasma beam.

7. The system according to claim 1, wherein the workpiece carried arrangement is operatively associated with one of a floating potential and an electrical source.

8. The system according to claim 7, wherein the source is one of an AC source, a DC source and a AC+DC source.

9. The system according to claim 1, wherein said plasma density is at most 10% of the maximal plasma.

10. The system according to claim 1, wherein the system is configured as a coating system.

11. The system according to claim 1, wherein said plasma density is at most 5% of the maximal plasma density.

12. The system according to claim 2, wherein the surface of rotation is cylindrical.

13. The system according to claim 7, whereas the electrical source is adjustable.

14. The system according to claim 1, wherein the system is configured as a coating to deposit metastable layers on workpieces, which metastable layers are selected from the group consisting of CBN layers, $\alpha$-$Al_2O_3$ layers, $C_3N_4$ layers and diamond layers.

15. The system according to claim 1, wherein the system is configured as a coating system to produce surface-treating reactive chemical compounds, including free radicals.

* * * * *